(12) United States Patent
Oishi

(10) Patent No.: US 7,746,168 B2
(45) Date of Patent: Jun. 29, 2010

(54) BIAS CIRCUIT

(75) Inventor: Kazuaki Oishi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 868 days.

(21) Appl. No.: 11/505,442

(22) Filed: Aug. 17, 2006

(65) Prior Publication Data
US 2007/0152752 A1 Jul. 5, 2007

(30) Foreign Application Priority Data
Jan. 4, 2006 (JP) .............................. 2006-000263

(51) Int. Cl.
*H03F 3/45* (2006.01)
(52) U.S. Cl. ...................... 330/252; 330/285
(58) Field of Classification Search ................. 330/261, 330/289, 296, 288
See application file for complete search history.

(56) References Cited

U.S. PATENT DOCUMENTS

| 6,323,725 B1 * | 11/2001 | Goldblatt et al. | 327/543 |
| 7,265,625 B2 * | 9/2007 | Klemmer | 330/261 |
| 7,471,152 B2 * | 12/2008 | Jiang et al. | 330/289 |

FOREIGN PATENT DOCUMENTS

| JP | 10-49244 A | 2/1989 |
| JP | 01-179507 A | 7/1989 |
| JP | 02-042804 A | 2/1990 |
| JP | 05-175753 A | 7/1993 |
| JP | 06-350357 A | 12/1994 |
| JP | 07-101825 A | 4/1995 |
| JP | 07-221567 A | 8/1995 |
| JP | 08-288754 A | 11/1996 |
| JP | 3113024 A | 9/2000 |
| JP | 2000-349573 A | 12/2000 |

OTHER PUBLICATIONS

Behzad Razavi; "Design of Analog CMOS Integrated Circuits"; McGraw Hill Higher Education; A Division of the McGraw-Hill Companies; 2001; pp. 107-108 and pp. 377-379.

* cited by examiner

*Primary Examiner*—Robert Pascal
*Assistant Examiner*—Hieu P Nguyen
(74) *Attorney, Agent, or Firm*—Arent Fox LLP

(57) ABSTRACT

A bias circuit of a resistance load differential amplifier comprises a first differential pair and a control unit for controlling a tail current of the first differential pair, and making an output current of the first differential pair being in inverse proportion to a load resistance in the resistance load differential amplifier when applying a constant potential difference to an input of the first differential pair. The control unit further controls a tail current of a second differential pair constituting the resistance load differential amplifier, and makes the tail current of the second differential pair being in direct proportion to the tail current of the first differential pair.

11 Claims, 11 Drawing Sheets

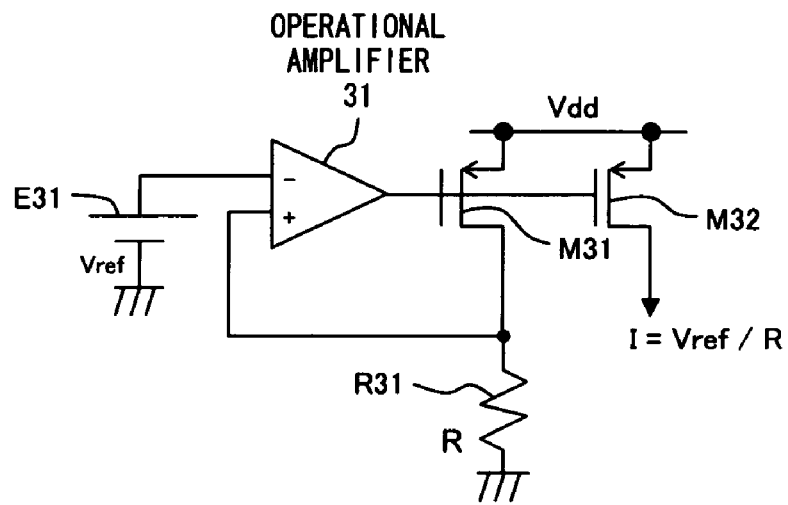
F I G. 6

//BIAS CIRCUIT

CROSS REFERENCE TO RELATED APPLICATIONS

This application is based upon and claims the benefit of priority from the prior Japanese Patent Application No. 2006-000263, filed Jan. 4, 2006, the entire contents of which are incorporated by reference.

BACKGROUND OF THE INVENTION

1. Field of the Invention

The present invention relates to a technique of an amplifier and particularly to a technique by which the gain in a resistance load differential amplifier is stabilized so as not to be influenced by variations in production conditions, temperature, and so forth.

2. Description of the Related Art

FIG. 1A shows a circuit configuration of a conventional resistance load differential amplifier. The circuit in FIG. 1A comprises transistors M101, M201 and M301, which are n-type MOSFETs (Metal Oxide Semiconductor Field Effect Transistors), and resistors R101 and R201.

In FIG. 1A, one of the terminals of each of the resistors R101 and R201 is connected to the corresponding drain of each of the transistors M101 and M201. The other terminal of each of the resistors R101 and R201 is connected to a power source Vdd. The respective sources of the transistors M101 and M201 are connected to the drain of the transistor M301, and the source of the transistor M301 is connected to the ground.

Signals INP and INM (which are differential signals input to the circuit of FIG. 1A) are respectively input to gates of the respective transistors M101 and M201. Signals OUTM and OUTP (which are differential outputs in the circuit of FIG. 1A) are respectively picked up at the connection node between the resistor R101 and the transistor M101, and at the connection node between the resistor R201 and the transistor M201. A bias voltage Bias is applied to the gate of the transistor M301 whose voltage determines the value of a current Iss flowing between the drain and the source of the transistor M301.

The circuit of FIG. 1A is configured as above. Accordingly, a differential pair is configured of the transistors M101 and M201 and the transistor M301 functions as a current source that determines the sum Iss of currents (i.e., tail current) flowing between the drain and the source of each of the transistors M101 and M201.

If it is assumed that a transconductance of the transistors M101 and M201 is Gm and a resistance value of resistors R101 and R201 is R, a gain Av of the circuit of FIG. 1A can be expressed by the equation below.

$$Av = Gm \times R \quad (1)$$

In other words, the gain Av has a directly proportional relationship with the product of the transconductance Gm and the resistance value R.

The transconductance Gm and the resistance value R vary when production conditions, temperature conditions or the like vary. If a circuit that is identical with the circuit of FIG. 1A is formed on a semiconductor substrate, variations of the transconductances Gm and variations of the resistance values R are essentially linked between the transistors or between the resistors.

Additionally, a circuit in which the gain Av has a directly proportional relationship with the product of the transconductance Gm and the resistance value R of the load resistance is not limited to being the circuit shown in FIG. 1A. The circuits having such a relationship will be explained below:

For example, a resistance load differential amplifier as shown in FIG. 1B is configured by connecting, in cascade, transistors M102 and M202 which are n-type MOSFETs to the transistors M101 and M201 in the circuit configuration shown in FIG. 1A. Specifically, this circuit is configured by inserting the transistor M102 to the connection node between the resistor R101 and the drain of the transistor M101 and inserting the transistor M202 to the connection node between the resistor R201 and the drain of the transistor M201. In addition, a constant voltage Vref is applied to the gate each of the transistors M102 and M202.

A circuit as shown in FIG. 10 is a mixer amplifier (mixer) for a resistance load. This circuit is configured by further adding, to the circuit of FIG. 1B, transistors M103 and M203 that are n-type MOSFETs. Specifically, this circuit has a configuration obtained by connecting the drain of the transistor M103 to the connection node between the resistor R201 and the drain of the transistor M202 and connecting the source of the transistor M103 to the connecting node between the source of the transistor M102 and the drain of the transistor M101 in the circuit of FIG. 1B, and then by connecting the drain of the transistor M203 to the connection node between the resistor R101 and the drain of the transistor M102 and connecting the source of the transistor M203 to the connection node between the source of the transistor M202 and the drain of the transistor M201 in the circuit of FIG. 1B. One of the two signals to be mixed is input to the gates of the transistors M101 and M201 as the differential signals INP and INM respectively. In addition, the other signal to be mixed is handled as differential signals LOP and LOM, the signal LOP being input to the gates of the transistors M102 and M202 and the signal LOM being input to the gates of the transistors M103 and M203.

Even in the circuits of FIG. 1B and FIG. 10, the gain Av of each circuit has a directly proportional relationship with the product of the transconductance Gm and the resistance value R.

In the resistance load differential amplifier in such a relationship, in order to stabilize the gain so as not to be influenced by variables such as are in a production condition and temperature, a circuit is proposed which creates a bias condition by which the transconductance Gm of the transistors constituting the differential pair has an inversely proportional relationship with the resistance value R of the load resistance. This circuit is based on the idea that, if the transconductance Gm has an inversely proportional relationship with the resistance value R so as to satisfy following equation (2), the gain is constant even when the transconductance Gm and the resistance value R vary.

$$Av = Gm \times R \propto (1/R) \times R = \text{Constant} \quad (2)$$

As an example of the bias circuit as above, the circuit shown in FIG. 2 is proposed in the document below.

"Design of Analog CMOS Integrated Circuits" by Behzad Razzavi (US), Published in 2001 by The McGraw-Hill companies, Inc. pages 107-108, and pages 377-379.

The circuit of FIG. 2 comprises transistors M111 and M112 (which are n-type MOSFETs), transistors M113 and M114 (which are p-type MOSFETs), and a resistor R111. In this configuration, the transistor M112 is provided such that the transistor size ratio (the ratio between the gate width W and the gate length L of the transistor element) is K times the transistor size ratio of the transistor M111 $(W/L)_N$. Furthermore, the transistor M113 and the transistor M114 are identical in their transistor size ratios $(W/L)_P$. It is assumed that the resistance value of the resistor R111 is $R_S$.

In FIG. 2, the drain and the gate of the transistor M111, the gate of the transistor M112, and the drain of the transistor M114 are connected. Accordingly, the transistor M111 is a diode-connected transistor. Additionally, the drain of the transistor M112, the drain and the gate of the transistor M113, and the gate of the transistor M114 are connected. Accordingly, the transistor M113 is also a diode-connected transistor.

Both sources of the transistors M113 and M114 are connected to the power source Vdd. The source of the transistor M111 is directly connected to the ground. The source of the transistor M112 is connected to the ground via the resistor R111.

In the above document, in FIG. 2, a current Iout flowing from the source to the drain of the transistor M113 is equal to a current Iref flowing from the source to the drain of the transistor M114. Accordingly, the equation below is satisfied.

$$Iout = \frac{2}{\mu_n C_{ox}(W/L)_N} \cdot \frac{1}{Rs^2}\left(1 - \frac{1}{\sqrt{K}}\right)^2 \quad (3)$$

In the above equation, $\mu_n$ is a constant value representing a mobility of carriers and $C_{ox}$ is a constant value representing a gate capacity.

Below, the input/output characteristic of a circuit in which the differential pair is constituted of MOS transistors is described:

A circuit shown in FIG. 3 comprises transistors M121, M221 and M321 which are n-type MOSFETs. In this configuration, the transistors M121 and M221 constituting the differential pair have the same transistor size ratio $(W/L)_N$ and the same transconductance Gm.

In FIG. 3, the sources of the respective transistors M121 and M221 are connected to the drain of the transistor M321, and the source of the transistor M321 is connected to the ground. Accordingly, the current that is the sum of a current Idp flowing through the transistor M221 and a current Idm flowing through the transistor M121 flows between the drain and the source of a transistor M321 as a tail current Iss. The value of the current Iss is determined based on the voltage Bias applied to the gate of the transistor M321.

In the above configuration, by means of a power source E221, a voltage of Vin+ΔVin/2 is applied to the gate of the transistor M221, and also, by means of a power source E121, a voltage of Vin−ΔVin/2 is applied to the gate of the transistor M121. Here, the voltage Vin is a common mode voltage, and the voltage ΔVin is a minimal differential voltage.

The above mentioned document discloses that when the minimal current is defined as ΔId=Idp−Idm, the transconductance Gm of the differential pair is expressed by the equation below.

$$Gm = \frac{\partial \Delta Id}{\partial \Delta Vin} = \frac{1}{2}\mu_n C_{ox}(W/L)_N \frac{\frac{4Iss}{\mu_n C_{ox}(W/L)_N} - 2\Delta Vin^2}{\sqrt{\frac{4Iss}{\mu_n C_{ox}(W/L)_N} - \Delta Vin^2}} \quad (4)$$

In the above equation, when ΔVin is sufficiently small, the above equation (4) can be approximate to the equation below.

$$Gm = \sqrt{\mu_n C_{ox}(W/L)_N Iss} \quad (5)$$

The tail current Iss in the circuit of FIG. 3 is made identical with the output current Iout in the circuit of FIG. 2. In other words, the equation of the current Iout expressed in the above equation (3) is substituted into Iss in the above equation (5). Then the equation below is obtained.

$$\begin{aligned} Gm &= \sqrt{\mu_n C_{ox}(W/L)_N \cdot Iss} \\ &= \sqrt{2 \cdot \mu_n C_{ox}(W/L)_N \cdot \frac{2}{\mu_n C_{ox}(W/L)_N} \cdot \frac{1}{Rs^2}\left(1 - \frac{1}{\sqrt{K}}\right)^2} \\ &= \frac{1}{Rs}\left(1 - \frac{1}{\sqrt{K}}\right) \end{aligned} \quad (6)$$

In the above equation, because K is a constant value, the transconductance Gm of the differential pair has an inversely proportional relation ship with the resistor Rs. In other words, the relationship of this equation (6) satisfies the equation (2). Accordingly, the gain Av of the circuit of FIG. 3 is constant (not being influenced by variations of production conditions or variations of a temperature, etc.).

As described above, in the bias circuit shown in FIG. 2, the output current Iout is determined based on the transistors M111 and M112. As is obvious from FIG. 2, the transistors M111 and M112 operate around the ground potentials. However, the transistors constituting the differential pair in the resistance load differential amplifier are generally operated by the potential which is about a half of the power voltage.

Here, the basic equation below expresses the input/output characteristic of the MOS transistor.

$$Id = \frac{\mu_n C_{ox}(W/L)_N}{2}(Vgs - Vth)^2 \quad (7)$$

In the above equation, Id represents a drain current, Vgs represents a gate-source voltage, and Vth represents a threshold voltage between the gate and the source.

The above equation (7) is the base of the above equations (3) through (6). Here, these respective equations are used based on the assumption that all the transistors that constitute the circuit have the same threshold voltage Vth. However, when the respective transistors have different operation potentials, the respective transistors have different threshold voltages Vth due to a substrate bias effect (body effect) or similar effects, and accordingly, the respective equations (3) through (6) are not precise.

As described above, because the transistors M111 and M112 in the bias circuit shown of FIG. 2 have the operation potential different from the operation potential of the transistors constituting the differential pair in the resistance load differential amplifier, the respective transistors have different threshold voltages Vth. Thus, in the circuit of FIG. 2, the respective equations (3) through (6) are not satisfied accurately, and as a result there is a problem in which the variation of the gain of the amplifier cannot be suppressed.

SUMMARY OF THE INVENTION

It is an object of the present invention to suppress the variation of a gain in a resistance load differential amplifier due to differences in operation voltages between transistors and to make the gain accurately constant.

A bias circuit in one aspect of the present invention is a bias circuit of a resistance load differential amplifier comprising a first differential pair and a control unit for controlling the tail current of the first differential pair such that the output current of the first differential pair when a constant potential difference is applied to the input of the first differential pair is in inverse proportion to the load resistance in the resistance load differential amplifier in which the control unit controls the tail current of the second differential pair constituting the resistance load differential amplifier such that the tail current of the second differential pair is in direct proportion to the tail current of the first differential pair.

According to this configuration, the transconductance of the second differential pair constituting the resistance load differential amplifier is in inverse proportion to the load resistance of the resistance load differential amplifier, and accordingly, the gain of the resistance load differential amplifier is accurate and constant.

In the above-described bias circuit according to the present invention, it is possible that the first differential pair and the second differential pair have the same circuit configuration.

Therefore, it is possible to create the transconductance of the second differential pair (constituting the resistance load differential amplifier being in inverse proportion to the load resistance of the resistance load differential amplifier) by making the tail current of the second differential pair in direct proportion to the tail current of the first differential pair.

Further, it is possible that the transistors constituting the first differential pair and the transistors constituting the second differential pair have the same transistor size ratio.

Thereby, it is possible to make the transconductance of the second differential pair constituting the resistance load differential amplifier in inverse proportion to the load resistance of the resistance load differential amplifier by making the tail current of the second differential pair equal to the tail current of the first differential pair.

Also, in the above bias circuit according to the present invention, it is possible that the control unit comprises a current mirror causing the current to flow in the same quantity into each of the respective transistors of a pair of transistors constituting the first differential pair, the current source causing the current in inverse proportion to the load resistance to flow, and a tail current control unit that makes the output current correspond to the current to flow via the power source by controlling the tail current of the first differential pair.

Therefore, it is possible to make the output current of the first differential pair in inverse proportion to the load resistance in the resistance load differential amplifier when giving a constant potential difference to the input of the first differential pair.

It is then possible that the trail current control unit controls the tail current of the first differential pair such that the voltage generated at the output node is a prescribed reference voltage when the current caused to flow by the current source flows into the output node of the differential pair.

In the above configuration, it is possible to make the output current of the first differential pair correspond to the current caused to flow by the current source.

It is further possible that the tail current control unit comprises a differential amplifier for comparing the voltage generated at the output node of the first differential pair and input to the differential amplifier with the prescribed reference voltage and controls the transistor that determines the tail current of the first differential pair by the output of the differential amplifier.

Thereby, it is possible to control the tail current of the first differential pair such that the voltage generated at the output node of the first differential pair is the prescribed reference voltage.

It is also possible that a capacitor or a capacitor and resistor in a series connection is connected between an input and an output of the differential amplifier.

Thereby, a phase compensation for the feed back control in the bias circuit is performed.

It is also possible that the transistor determining the tail current of the second differential pair is controlled by the output of the differential amplifier.

Thereby, it is possible to make the tail current of the second differential pair in direct proportion to the tail current of the first differential pair.

Also, in the above configuration, it is possible that the tail current control unit constitutes a differential amplifier for comparing the voltage generated at the output node of the first differential pair and input to the differential amplifier with the prescribed reference voltage, first and second transistors for controlling the current based on the output of the comparison value, and a current mirror, which, together with the transistor determining the tail current of the first differential pair, comprises a third transistor, which is a diode-connected transistor, causes a current controlled by the first transistor to flow to the third transistor, and controls the transistor determining the tail current of the second differential pair by the current controlled by the second transistor.

Through the above configuration, it is possible to control the tail current of the first differential pair such that the voltage generated at the output node of the first differential pair is the prescribed reference voltage, and further that the tail current of the second differential pair is in direct proportion to the tail current of the first differential pair.

Then, it is possible that the control unit further comprises a fourth transistor constituting a current mirror, which, together with the transistor that determines the tail current of the second differential pair, is a diode-connected transistor, and causes the current controlled by the second transistor to flow into the fourth transistor.

Thereby, it is possible to control the transistor that determines the trail current of the second differential pair by the current controlled by the second transistor.

It is further possible that a capacitor or a capacitor and resistor in a series connection is connected between an input of the differential amplifier and a connection node between the third transistor and the transistor that determines the tail current of the first differential pair.

Thereby, the phase compensation is performed for the feed back control in the bias circuit.

According to the present invention, as above, variation of a gain of the resistance load differential amplifier due to the difference of operation voltages between transistors is suppressed, and the gain is both accurate and constant.

BRIEF DESCRIPTION OF THE DRAWINGS

The present invention will be more apparent from the following detailed description when the accompanying drawings are referenced.

FIG. 6 shows a specific circuit configuration example of a current source;

DESCRIPTION OF THE PREFERRED EMBODIMENTS

Figure 1A:
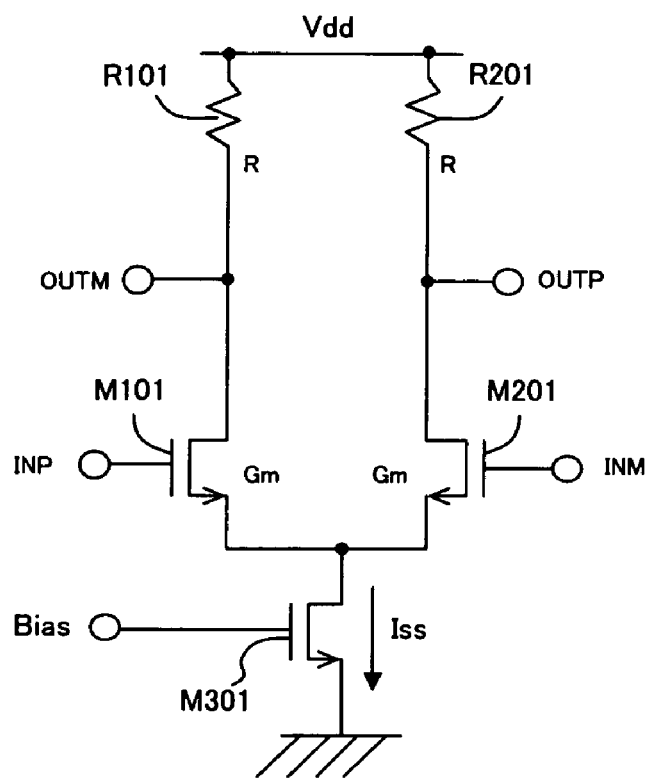
FIG. 1A shows a circuit configuration of a conventional resistance load differential amplifier.

Hereinbelow, embodiments of the present invention will be explained, by referring to the drawings.

Figure 4:
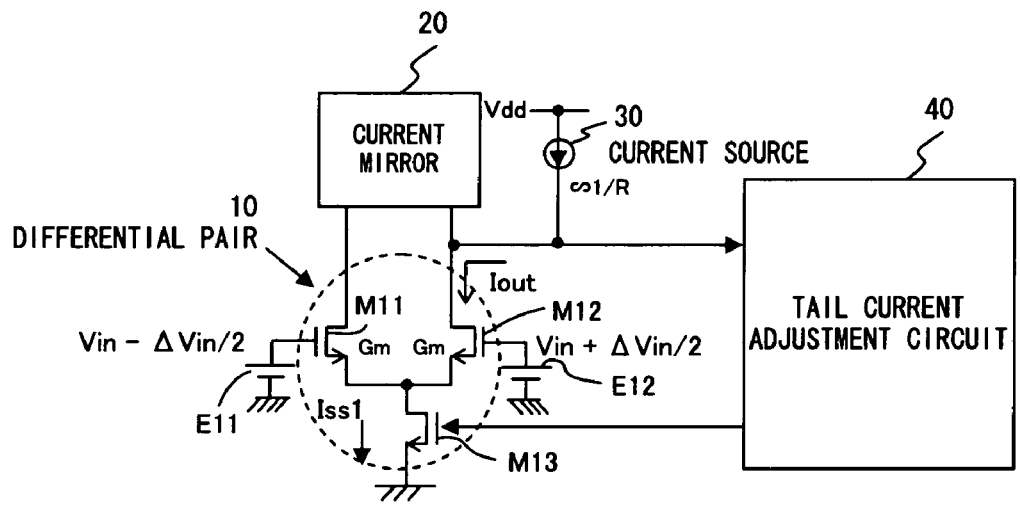
FIG. 4 shows a principle configuration of a bias circuit embodying the present invention.

First, FIG. 4 is explained. FIG. 4 shows a principle configuration of a bias circuit (Gm correction circuit) which embodies the present invention.

In FIG. 4, a differential pair 10 comprises transistors M11 and M12, which are n-type MOSFETs. The sources of the respective transistors M11 and M12 are connected to a drain of a transistor M13 that is an n-type MOSFET, and the source of the transistor M13 is connected to the ground. Accordingly, the sum of the currents flowing between the drain and the source of the transistor M11 and between the drain and the source of the transistor M12, i.e., a tail current Iss1 of the differential pair 10, flows between the drain and the source of the transistor M13. In other words, the transistor M13 is a transistor that determines the value of the tail current Iss1 of the differential pair 10.

A voltage of Vin−ΔVin/2 is applied to the gate of the transistor M11 by a constant voltage source E11, and a voltage of Vin+ΔVin/2 is applied to the gate of the transistor M12 by a constant voltage source E12. In other words, a constant potential difference ΔVin is given to the input of the differential pair 10. The voltage Vin is, for example, a voltage of about half of power source voltage Vdd of the circuit.

A current mirror 20 causes currents to flow in the same quantity into the respective drains of the pair of the transistors M11 and M12 constituting the differential pair 10.

A current source 30 causes the flow of a current whose current value is in inverse proportion to the variation of the resistance value of a load resistance in a resistance load differential amplifier for which gain stabilization is performed. This current flows into the drain of the transistor M12 that is the output node of the differential pair 10.

A tail current adjustment circuit 40 controls the tail current Iss1 of the differential pair 10 by changing the voltage applied to the gate of the transistor M13, and makes the output current of the differential pair 10 correspond to the current caused to flow by the current source 30. Furthermore, the tail current adjustment circuit 40 controls the tail current of the differential pair constituting the resistance load differential amplifier for which gain stabilization is performed, and makes this tail current direct proportion the change of the tail current Iss1 of the differential pair 10.

Next, an operation principle of the configuration shown in FIG. 4 is explained.

When the input voltage ΔVin applied to the differential pair is sufficiently small, the output current ΔId of the differential pair is expressed by the equation below, as it is also expressed by the equation (4).

$$\Delta Id = Gm \times \Delta Vin \qquad (8)$$

In the above, the transconductance Gm is in direct proportion to the one-half of the tail current as shown in the above equation (5).

Then, as shown in FIG. 4, when the input voltage ΔVin is constant, the current whose current value is α×1/R (α is a constant value, and R is the resistance value of the load resistance in the resistance load differential amplifier for which gain stabilization is performed) is caused to flow from the current source 30 into the drain of the transistor M12 (which is the output of the differential pair 10). Then, the voltage applied to the gate of the transistor M13 is controlled by a feedback control by the tail current adjustment circuit 40, and the tail current Iss1 of the differential pair 10 is adjusted such that the output current Iout of the differential pair 10 (i.e., ΔId) corresponds to the current caused to flow from the current source 30 (i.e., α×1/R). When this output current Iout corresponds to the current (α×1/R), the transconductance Gm of the differential pair 10 is expressed by the equation below and is in inverse proportion to the variation of the load resistance R.

$$Gm = \frac{\Delta Id}{\Delta Vin} = \frac{\alpha}{R \cdot \Delta Vin} \propto \frac{1}{R} \qquad (9)$$

As above, in the circuit of FIG. 4, the tail current Iss1 of the differential pair 10 is controlled such that when the constant potential difference ΔVin is given to the input of the differential pair 10, the output Iout of the differential pair 10 is in inverse proportion to the load resistance in the resistance load differential amplifier.

The transistor size ratio of the differential pair constituting the resistance load differential amplifier for which gain stabilization is performed and the transistor size ratio of the differential pair of FIG. 4 are made the same, and the current, which is the same as the tail current of the differential pair 10 of FIG. 4, is caused to flow as the tail current of the differential pair constituting the resistance load differential amplifier. Thus the transconductances Gm of the differential pairs are the same. As a result of this, the above equation (2) is satisfied in the resistance load differential amplifier, and the gain Av there is constant.

Furthermore, in this case, it is possible to operate the differential pair 10 of FIG. 4 and the differential pair in the resistance load differential amplifier at almost the same operation potential (e.g., on the order of half of the power source voltage). Accordingly, it is possible to eliminate the difference in the threshold voltages Vth between the respective transistors due to a substrate bias effect or the like almost completely. Accordingly, it is possible to make the gain of the resistance load differential amplifier accurate.

In the above explanation, in order to facilitate understanding, the current that is the same as the tail current of the differential pair 10 of FIG. 4 is caused to flow as the tail current of the differential pair constituting the resistance load differential amplifier for which gain stabilization is performed. However, it is obvious that when the tail current of the differential pair constituting the resistance load differential amplifier is made to be in direct proportion to the tail current of the differential pair 10 of FIG. 4, the above equation (9) is satisfied so that the gain of the resistance load differential pair is constant accurately based on the equation (5).

Figure 5:
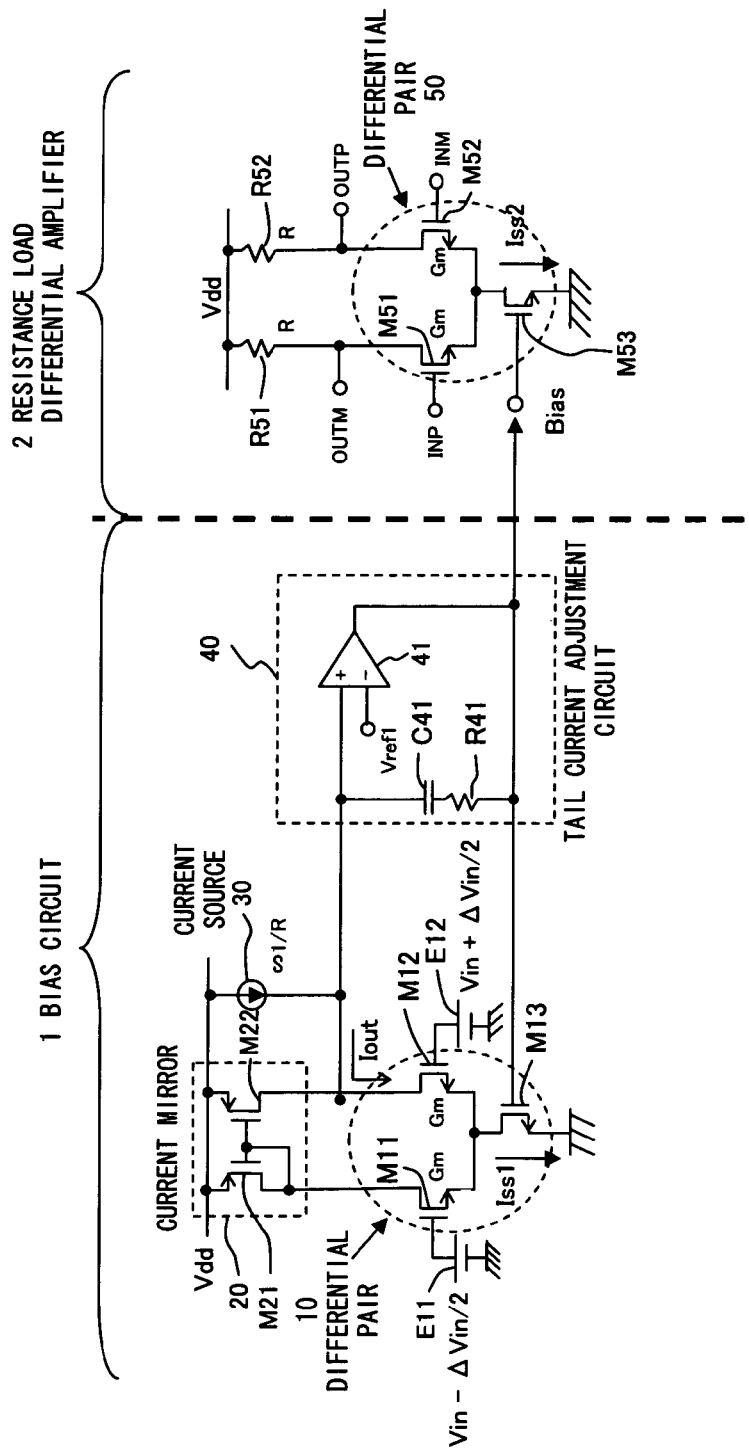
FIG. 5 shows a configuration of a first embodiment.

Next, FIG. 5 will be explained. FIG. 5 shows a configuration of a first embodiment of the present invention. In this embodiment, a bias circuit 1 stabilizes a gain of a resistance load differential amplifier 2.

The bias circuit 1 shown in FIG. 5 shows a specific circuit configuration of the bias circuit whose principle configuration is shown in FIG. 4, in which like symbols denote like constituents.

The bias circuit 1 comprises the differential pair 10, the constant voltage sources E11 and E12, the current mirror 20, the current source 30, and the tail current adjustment circuit 40.

The differential pair 10 has a configuration in which the transistors M11 and M12 (both n-type MOSFETs) are connected similarly as with the configuration of FIG. 4. The transistor M13, which is an n-type MOSFET, has a configuration which is the same as that of FIG. 4. Accordingly, the transistor M13 is a transistor that determines the value of the tail current Iss1 of the differential pair 10.

The constant voltage sources E11 and E12 apply the voltage of Vin−ΔVin/2 and the voltage of Vin+ΔVin/2 respectively to the gate of the transistor M11 and the gate of the transistor M12 as inputs of the differential pair 10 in order to give a constant potential difference (ΔVin) to both of them.

The current mirror 20 causes the currents to flow in the same quantity into the drains of the transistors M11 and M12 constituting the differential pair 10. The current mirror 20 comprises transistors M21 and M22 which are p-type MOSFETs. The drain and the gate of the transistor M21 are connected. Accordingly, the transistor M21 is a diode-connected transistor. The drain and the gate of this transistor M21 are further connected to the gate of the transistor M22, and to the drain of the transistor M11 constituting the differential pair 10. Also, the drain of the transistor M22 is connected to the drain of the transistor M11 constituting the differential pair 10, and both of the drains of the transistors M21 and M22 are connected to the power source Vdd.

The current source 30 causes the current, whose current value is in inverse proportion to the variation of the resistance value of the load resistance in the resistance load differential amplifier 2, to flow, and causes the current to flow into the drain of the transistor M12 which is the output node of the differential pair 10.

FIG. 6 shows a specific configuration of the current source 30. The circuit of FIG. 6 comprises an operational amplifier 31, a constant voltage source E31, transistors M31 and M32 (both of which are p-type MOSFETs), and a resistor R31. In this configuration, the resistor R31 has a resistance value R which is in direct proportion to resistors R51 and R52 (which are load resistors in the resistance load differential amplifier 2), and a resistor R31 that is provided on a semiconductor substrate (which is the same as the substrate on which the resistors R51 and R52 are provided), such that the variations of the resistance value R influenced by the production conditions, the temperature conditions and the like are linked between the resistors.

A reference voltage Vref is applied to an inversion input (minus side input) of the operational amplifier 31 by the constant voltage source E31, and an output of the operational amplifier 31 is connected to each of the gates of the transistors M31 and M32. Further, between the grand and the drain of the transistor M31, the resistor R31 is inserted, and also a non-inversion input (plus side input) of the operational amplifier 31 is connected to the connection node between the resistor R31 and the drain of the transistor M31.

Both of the sources of the transistors M31 and M32 are connected to the power source Vdd, and the output current I of the current source 30 is caused to flow from this source of the transistor M32.

In the circuit of FIG. 6, because of the function of the operational amplifier 31, the non-inversion input of the operational amplifier 31 is kept to have the same potential as the inversion input of the operational amplifier 31. Accordingly, the potential at the connection node between the resistor R31 and the drain of the transistor M31 is the reference voltage Vref. The value of the current I flowing through the resistor R31 is Vref/R. The current I is the drain current caused to flow from the transistor M31, and accordingly, the operational amplifier 31 applies, to the gate of the transistor M31, the voltage that can cause such a drain current to flow.

When the current source 30 is configured as above for example, it is possible to cause a current (α×1/R) whose current value is in inverse proportion to the variation of the resistance value R of the load resistance in the resistance load differential amplifier 2 to flow.

In the above configuration, since the voltage which is the same as the voltage applied to the gate of the transistor M31 is applied to the gate of the transistor M32 by the operational amplifier 31, the transistor M32 flows the drain current which is the same as that of the transistor M31 in quantity (i.e., the current I). The value of this current I is Vref/R, and therefore is in inverse proportion to the variations of the resistance value R of the resistors R51 and R52 which are load resistors in the resistance load differential amplifier 2.

Again, FIG. 5 is explained.

The tail current adjustment circuit 40 comprises a differential amplifier 41, a capacitor C41, and a resistor R41, controls the tail current Iss1 of the differential pair 10 by changing the voltage applied to the gate of the transistor M13, and makes the output current of the differential pair 10 correspond to the current caused to flow by the current source 30.

A voltage generated in the drain of the transistor M12 that is the output node of the differential pair 10 is input to the non-inversion input (plus side input) of the differential amplifier 41. A prescribed reference voltage Vref1 is applied by a constant voltage source (not shown) to the inversion input (minus side input) of the differential amplifier 41. The differential amplifier 41 compares the magnitudes of these voltages. Then, when the voltage at the output node of the differential pair 10 is higher than the reference voltage Vref1, the output voltage of the differential amplifier 41 is increased, and when the voltage at the output node of the differential pair 10 is lower than the reference voltage Vref1, the output voltage of the differential amplifier 41 is decreased.

The output voltages of the differential amplifier 41 are respectively applied to the gate of the transistor M13 determining the tail current Iss1 of the differential pair 10, and to the gate of a transistor M53 (which will be described later). Accordingly, the transistors M13 and M53 are controlled by the outputs of the differential amplifier 41.

Further, the capacitor C41 and the resistor R41 in a series connection are connected between the input (non-inversion input) and the output of the differential amplifier 41.

The resistance load differential amplifier 2 has the same circuit configuration as that of FIG. 1A, and therefore it comprises transistors M51, M52 and M53 which are n-type MOSFETs, and the resistors R51 and R52.

As described above, it is assumed that resistance values of both of the resistors R51 and R52 are R. One terminal of each of the resistors R51 and R52 is connected to the drain of each of the transistors M51 and M52. The other terminal of each of the resistors R51 and R52 is connected to the power source Vdd. The source of each of the transistors M51 and M52 is connected to the drain of the transistor M53, and the source of the transistor M53 is connected to the ground.

The signals INP and INM, which are differential signals input to the resistance load differential amplifier 2, are respectively input to the gates of the transistors M51 and M52. The signals OUTM and OUTP, which are differential outputs in the resistance load differential amplifier 2, are respectively picked up at the connection node between the resistor R51 and the transistor M51 and the connection node between the resistor R52 and the transistor M52. Also, the output voltage of the differential amplifier 41 of the tail current adjustment circuit 40 is applied to the gate of the transistor M53 as the bias voltage Bias determining the value of a current Iss2 flowing between the drain and the source of the transistor M53.

The resistance load differential amplifier 2 is configured as above. In this configuration, a differential pair 50 is constituted of the transistors M51 and M52, and this configuration is the same as the circuit configuration of the differential pair 10 in the bias circuit 1. The transistor M53 functions as a current source that determines a sum of currents flowing between the drain and the source of each of the transistors M51 and M52 (i.e., the tail current Iss2 of the differential pair 50).

Next, a situation will be explained in which the transconductance Gm of the differential pair 10 is converged such that it has an inversely proportional relationship with the resistance value R of the load resistors R51 and R52 by means of the feed back control by the tail current adjustment circuit 40 in the circuit of FIG. 5.

Here, it is assumed that the transconductance Gm of the differential pair 10 of the bias circuit 1 is smaller than the final convergence value. In this case, the output current ΔId (i.e., Iout) of the differential pair 10 becomes smaller in accordance with the above equation (8).

The current source 30 causes the above current (α×1/R) into the output node of the differential pair 10, and accordingly, the voltage generated at this output node increases. The voltage at this output node is applied to the non-inversion input of the differential amplifier 41, and accordingly, when this voltage becomes higher than the reference voltage Vref1, the output voltage of the differential amplifier 41 increases. This output voltage is applied to the gate of the transistor M13 determining the tail current Iss1 of the differential pair 10, and accordingly, the increase of this output voltage increases the tail current Iss1. Then, as is obvious from the above equation (5), the increase of the tail current Iss1 increases the transconductance Gm of the differential pair 10.

In the bias circuit 1 of FIG. 5, the feed back control as above is performed. This control operation converges when the output current ΔId (i.e., Iout) of the differential pair 10 corresponds to the current (α×1/R) caused to flow by the current source 30, then the voltage generated at the output node of the differential pair 10 is the reference voltage Vref. In other words, the differential amplifier 41 of the tail current adjustment circuit 40 controls the tail current Iss1 of the differential pair 10 such that the voltage generated at the output node is the voltage Vref when the current caused to flow by the current source 30 flows into the output node of the differential pair 10.

Here, the value of the reference voltage Vref needs to be the one at which each of the transistors M11, M21, M13, M21, and M22 operates in region. The value of the reference voltage Vref is, for example, about half of the value of a power source voltage Vdd.

The capacitor C41 and the resistor R41 in a series connection, which are inserted between the input and the output of the differential amplifier 41, are for phase compensation, prevent oscillation due to the feed back formed in the bias circuit 1. Also, in the above configuration, it is possible that the resistor R41 is canceled (i.e., the resistance value of the resistor R41 is made zero) and the phase compensation is performed by inserting only the capacitor C41 between the input and the output of the differential amplifier 41.

As described above, the voltage output from the differential amplifier 41 of the tail current adjustment circuit 40 in the bias circuit 1 is also applied to the gate of the transistor M53 in the resistance load differential amplifier 2. Accordingly, when the transistor size ratios of the transistors M13 and M53 are the same, the tail current Iss2 of the differential pair 50 is equal to the tail current Iss1 of the differential pair 10.

In the above configuration, when the transistor size ratios of the transistors M51 and M52 constituting the differential pair 50 are the same as those of the transistors M11 and M12 constituting the differential pair 10, the transconductance Gm of the differential pair 50 is equal to that of the differential pair 10. In this case, when the feed back control converges in the bias circuit 1, the transconductance Gm is in inverse proportion to the resistance value R of the load resistors R51 and R52 of the resistance load differential amplifier 2, and accordingly, the gain of the resistance load differential amplifier 2 is stabilized.

Also, in the circuit shown in FIG. 5, it is not always necessary that the transconductance Gm of the differential pair 50 be equal to that of the differential pair 10 in order that the transconductance Gm of the differential pair 50 is in inverse proportion to the resistance value R of the load resistors R51 and R52. All needed is that the transconductance Gm of the differential pair 50 is in direct proportion to that of the differential pair 10. Accordingly, when the circuit configuration of the differential pair 50 is the same as that of the differential pair 10, the transistor size ratios can differ between the transistors M51 and M52 constituting the differential pair 50 and between the transistors M1 and M12 constituting the differential pair 10 as expressed by the above equation (5).

In addition, if the tail current Iss2 is in direct proportion to the tail current Iss1 of the differential pair 10 when the transistor M53 determining the tail current Iss2 of the differential pair 50 is controlled by the output of the differential amplifier 41, it is possible to maintain the proportional relationship between the transconductance Gm of the differential pair 50 and the transconductance Gm of the differential pair 10 as expressed in the above equation (5). Accordingly, the transistor size ratio of the transistor M13 may be different from that of the transistor M53.

Figure 7:
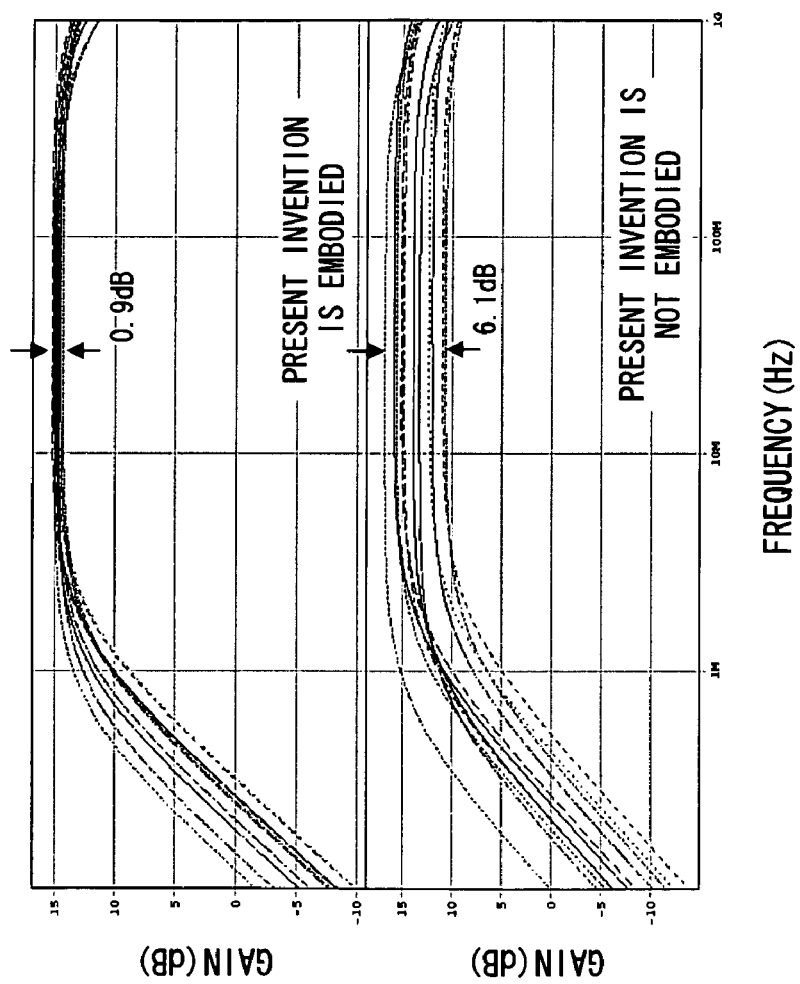
FIG. 7 shows simulation results of gain characteristics of the resistance load differential amplifier.

Now, FIG. 7 will be explained. FIG. 7 shows simulation results of gain characteristics of the resistance load differential amplifier 2. In FIG. 7, computer simulation results under the worst corner condition in which production variations between semiconductor integrated circuits, temperature variations, and variations of power source voltage are combined.

In FIG. 7, the upper graph shows the gain characteristic in a case in which the bias circuit 1 embodying the present invention is used, and the lower graph shows the case in which the bias circuit 1 embodying the present invention is not used (i.e., the conventional case in which the correction of the transconductance Gm is not performed, and the tail current Iss is in inverse proportion to the load resistance).

As is obvious from FIG. 7, by embodying the present invention, it is possible to make gain of the resistance load amplifier constant accurately.

Figure 8:
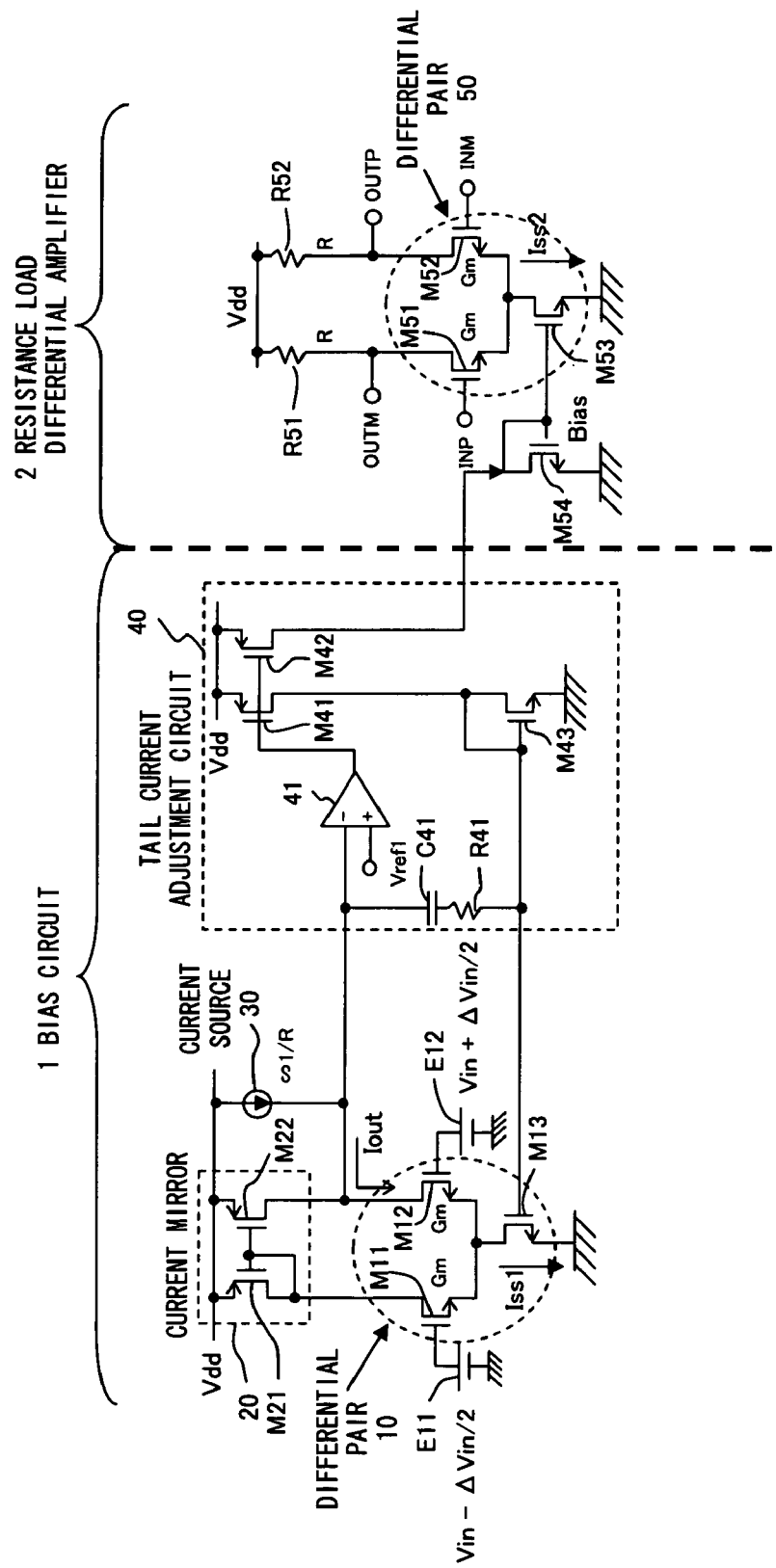
FIG. 8 shows a configuration of a second embodiment of the present invention.

Next, FIG. 8 will be explained. FIG. 8 shows a configuration of a second embodiment of the present invention. In FIG. 8, like constituents as in the first embodiment shown in FIG. 5 are denoted by like symbols.

The configuration of FIG. 8 is different from that of FIG. 5 in the sense that the configuration of the tail current adjustment circuit 40 is different and that a transistor M54 is added to the resistance load differential amplifier 2. Therefore, these differences will be explained.

In FIG. 8, the tail current adjustment circuit 40 comprises, in addition to the differential amplifier 41, the capacitor C41, and the resistors R41, transistors M41 and M42 which are p-type MOSFETs, and a transistor M43 which is an n-type MOSFET, and controls the tail current Iss1 of the differential pair 10 by changing the voltage applied to the gate of the transistor M13 such that the output current of the differential pair 10 corresponds to the current caused to flow by the current source 30.

A voltage generated in the drain of the transistor M12, which is the output node of the differential pair 10, is inputted to the inversion input (minus side input) of the differential amplifier 41. The prescribed reference voltage Vref1 is applied by a constant voltage source (not shown) to the non-inversion input (plus side input) of the differential amplifier 41. The differential amplifier 41 compares the magnitudes of these voltages. Then, when the voltage at the output node of the differential pair 10 is higher than the reference voltage Vref1, the output voltage of the differential amplifier 41 is decreased, and when the voltage at the output node of the differential pair 10 is lower than the reference voltage Vref1, the output voltage of the differential amplifier 41 is increased.

The output voltage of the differential amplifier 41 is applied to the gates of the respective transistors M41 and M42. The sources of these respective transistors M41 and M42 are connected to the power source Vdd. Accordingly, the current flowing between the source and the drain of each of the transistors M41 and M42 is controlled by the output of the differential amplifier 41.

The drain of the transistor M41 is connected to the drain and gate of the transistor M43 and to the gate of the transistor M13. The sources of these respective transistors M43 and M13 are connected to the ground. Accordingly, the transistor M43 is a diode-connected transistor and constitutes the current mirror together with the transistor M13 determining the tail current Iss1 of the differential pair 10.

The current caused to flow from the drain of the transistor M41 flows between the drain and the source of the transistor M43. In this configuration, the transistor M43 constitutes the current mirror together with the transistor M13. Accordingly, if the transistor size ratios of the transistors M43 and M13 are the same, the current flowing between the drain and the source of the transistor M43 is equal to the current flowing between the drain and the source of the transistor M13. In other words, in this case, the current caused to flow from the drain of the transistor M41 is equal to the tail current Iss1 of the differential pair 10. Accordingly, the output of the differential amplifier 41 controls the tail current Iss1 of the differential pair 10 in this circuit of FIG. 8 as well.

The drain and the gate of the transistor M54 (i.e., an n-type MOSFET) are connected to the gate of the transistor M53 in the resistance load differential amplifier 2 of FIG. 8. The sources of the respective transistors M54 and M53 are connected to the ground. Accordingly, the transistor M53 is a diode-connected transistor, and constitutes the current mirror together with the transistor M53 which determines the tail current Iss2 of the differential pair 50.

The gate voltage (voltage between the gate and the source) equal to that of the gate of the transistor M41 is applied to the gate of the transistor M42. In this configuration, when the transistor size ratios of the transistors M42 and M41 are the same, the current caused to flow from the drain of the transistor M42 is equal to the current caused to flow from the drain of the transistor M42. In other words, the transistor M42 causes the current equal to the tail current Iss1 of the differential pair 10 to flow from the drain.

The current caused to flow from the drain of the transistor M42 flows into the drain of the transistor M54 in the resistance load differential amplifier 2. In this configuration, the transistor M54 constitutes the current mirror together with the transistor M53. Accordingly, in this case, the current caused to flow from the drain of the transistor M42 controls the transistor M53 determining the tail current Iss2 of the differential pair 50. Especially when the transistor size ratios of the transistors M54 and M53 are the same, the current flowing between the drain and the source of the transistor M54 is equal to the current flowing between the drain and the source of the transistor M53. In other words, in this case, the tail current Iss1 of the differential pair 10 is equal to the tail current Iss2 of the differential pair 50.

Next, a situation will be explained in which the transconductance Gm of the differential pair 10 is converged such that it has an inversely proportional relationship with the resistance value R of the load resistors R51 and R52 by means of the feed back control by the tail current adjustment circuit 40 in the circuit of FIG. 8.

Here, it is assumed that the transconductance Gm of the differential pair 10 of the bias circuit 1 is smaller than the final convergence value. The output current $\Delta$Id (i.e., Iout) of the differential pair 10 becomes smaller in accordance with the above equation (8).

The current source 30 causes the above current ($\alpha \times 1/R$) to flow into the output node of the differential pair 10, and accordingly, the voltage generated at this output node increases. The voltage at this output node is applied to the non-inversion input of the differential amplifier 41, and accordingly, when this voltage becomes higher than the reference voltage Vref, the output voltage of the differential amplifier 41 decreases. This output voltage is applied to the gate of the transistor M41 determining the tail current Iss1 of the differential pair 10, and accordingly, the decrease of this output voltage increases the tail current Iss1. Then, as is obvious from the above equation (5), the increase of the tail current Iss1 increases the transconductance Gm of the differential pair 10.

The feed back control as above is performed in the bias circuit 1 of FIG. 8. This control operation converges when the output current $\Delta$Id (i.e., Iout) of the differential pair 10 corresponds to the current ($\alpha \times 1/R$) caused to flow by the current source 30, and here, the voltage generated at the output node of the differential pair 10 is the reference voltage Vref. In other words, the differential amplifier 41 of the tail current adjustment circuit 40 controls the tail current Iss1 of the differential pair 10 such that the voltage generated at the output node is the voltage Vref when the current caused to flow by the current source 30 flows into the differential pair 10.

Here, the reference voltage Vref needs to be the one at which each of the transistors M11, M21, M13, M21 and M22 operates in a saturation region. The value of the reference voltage Vref is, for example, about half of the value of a power source voltage Vdd.

The capacitor C41 and the resistor R41 in a series connection, which are inserted between the input of the differential amplifier 41 and the gate of the transistor M43, are for phase compensation, and prevent oscillation due to the feedback formed in the bias circuit 1. Also, in the above configuration, it is possible that the resistor R41 is canceled (i.e., the resistance value of the resistor R41 is made zero) and the phase compensation is performed by inserting only the capacitor C41 between the input of the differential amplifier 41 and the gate of the transistor M43.

As described above, the voltage output from the differential amplifier 41 of the tail current adjustment circuit 40 in the bias circuit 1 is also applied to the gate of the transistor M42. Accordingly, when the transistor size ratios of the transistors M41 and M42 are the same and the transistor size ratios of the transistors M13, M43, M54, and M53 are the same, the tail current Iss2 of the differential pair 50 is equal to the tail current Iss1 of the differential pair 10.

In the above configuration, when the transistor size ratios of the transistors M51 and M52 (constituting the differential pair 50) are the same as those of the transistors M11 and M12 constituting the differential pair 10, the transconductance Gm of the differential pair 50 is equal to that of the differential pair 10. In this case, when the feed back control converges in the bias circuit 1, the transconductance Gm is in inverse proportion to the resistance value R of the load resistors R51 and R52 of the resistance load differential amplifier 2; and accordingly, the gain of the resistance load differential amplifier 2 is stabilized.

Furthermore, in the circuit shown in FIG. 8, it is not always necessary that the transconductance Gm of the differential pair 50 be equal to that of the differential pair 10 in order that the transconductance Gm of the differential pair 50 is in inverse proportion to the resistance value R of the load resistors R51 and R52. All needed is that the transconductance Gm of the differential pair 50 is in direct proportion to that of the differential pair 10. Accordingly, when the circuit configuration of the differential pair 50 is the same as that of the differential pair 10, the transistor size ratios can be different between the transistors M51 and M52 constituting the differential pair 50 and between the transistors M11 and M12 constituting the differential pair 10 as expressed by the above equation (5).

Also, if the tail current Iss2 is in direct proportion to the tail current Iss1 of the differential pair 10 when the transistor M42 determining the tail current Iss2 of the differential pair 50 is controlled by the differential amplifier 41, it is possible to maintain the proportional relationship between the transconductance Gm of the differential pair 50 and the transconductance Gm of the differential pair 10 as expressed in the above equation (5). Accordingly, the transistor size ratio of the transistor M41 may be different from that of the transistor M42, and also, the transistor size ratios may be different between the transistors M13, M43, M54, and M53.

In the above, the embodiments of the present invention are explained. However, the present invention is not limited to the above embodiments, and allows for various modifications/alternations without departing from the spirit of the present invention.

Figure 1B:
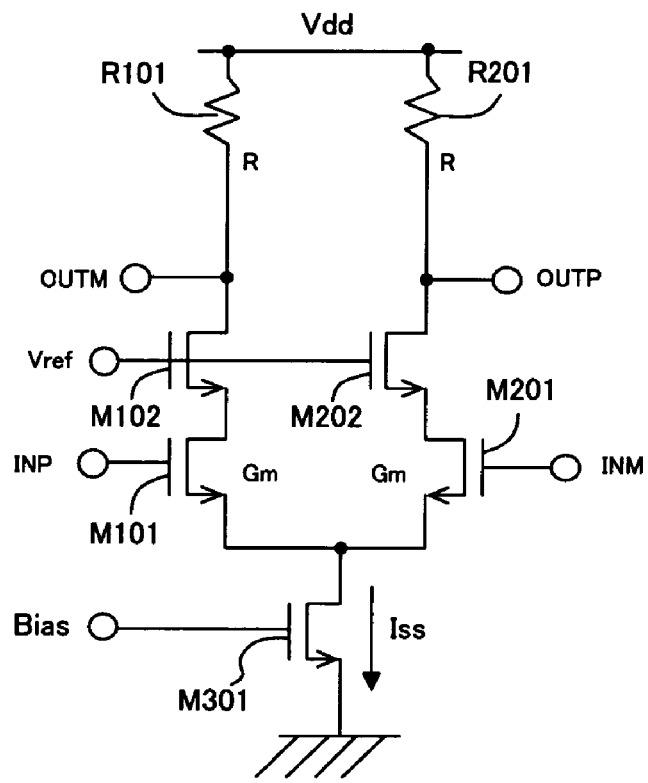
FIG. 1B shows a circuit configuration of a resistance load differential amplifier in which a differential pair is configured of a cascade connection of transistors.
Figure 1C:
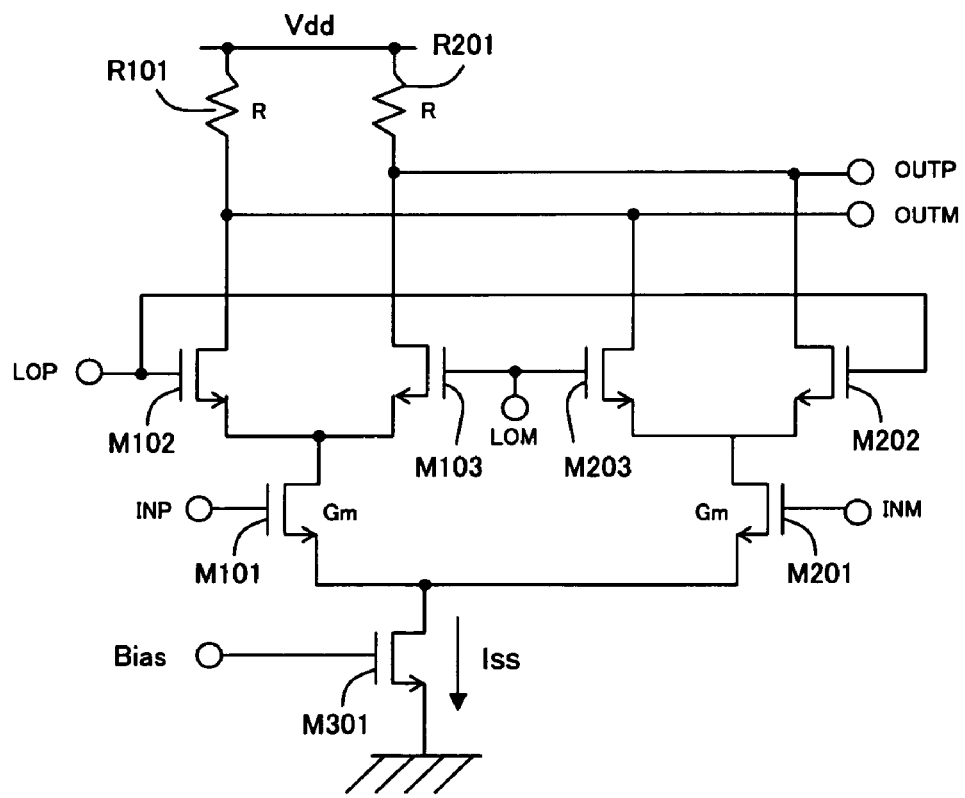
FIG. 1C shows a circuit configuration of a mixer amplifier of a resistance load.
Figure 2:
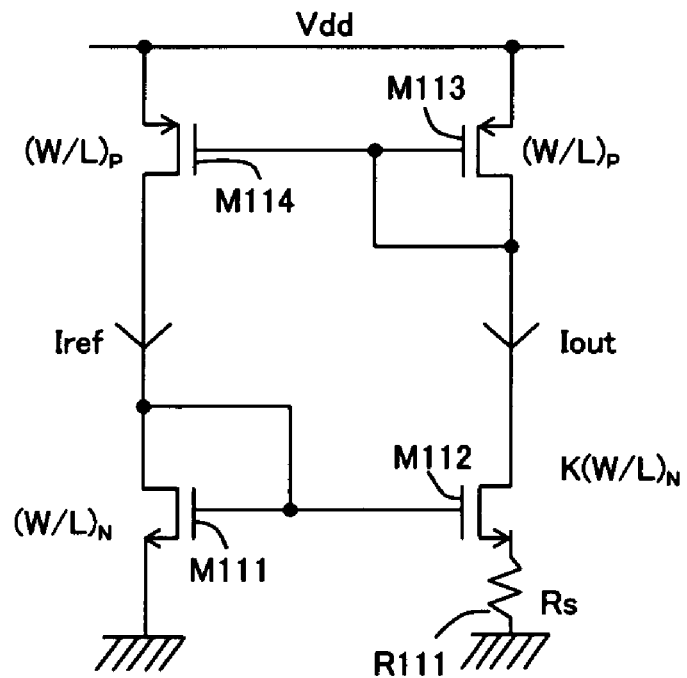
FIG. 2 shows an example of a conventional Gm correction bias circuit.
Figure 3:
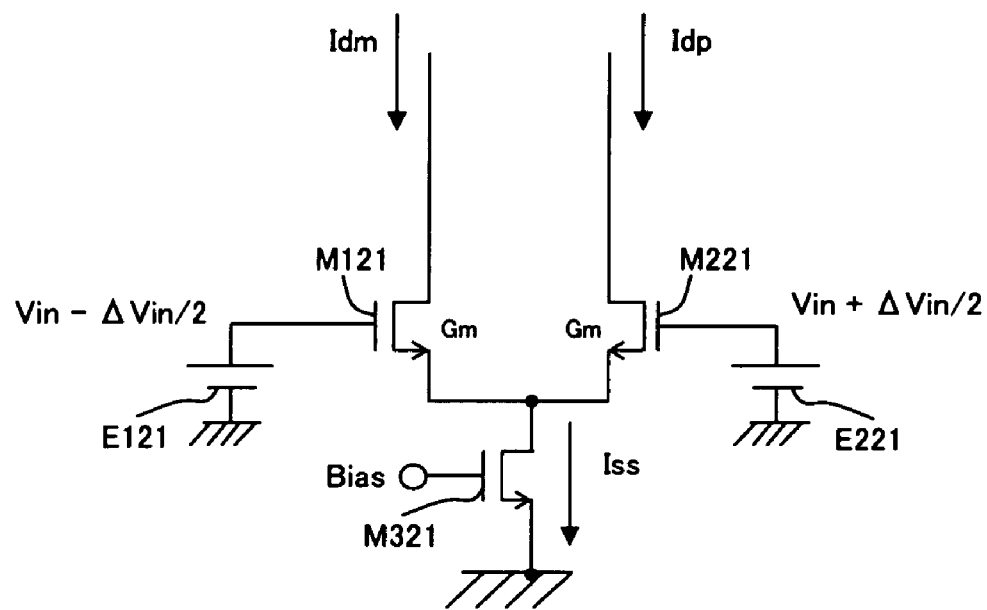
FIG. 3 explains input/output characteristic of a circuit in which a differential pair is configured of MOS transistors.

Additionally, the present invention can be applied to any resistance load differential amplifier in which the gain Av of the circuit is in direct proportion to the product of the transconductance Gm and the resistance value R. In other words, the present invention can be applied not only to the resistance load differential amplifier having the conventional circuit configuration as shown in FIG. 1A used for the explanation of the embodiments, but also to, for example, the resistance load differential amplifiers shown in FIG. 1B and FIG. 1C.

Figure 9:
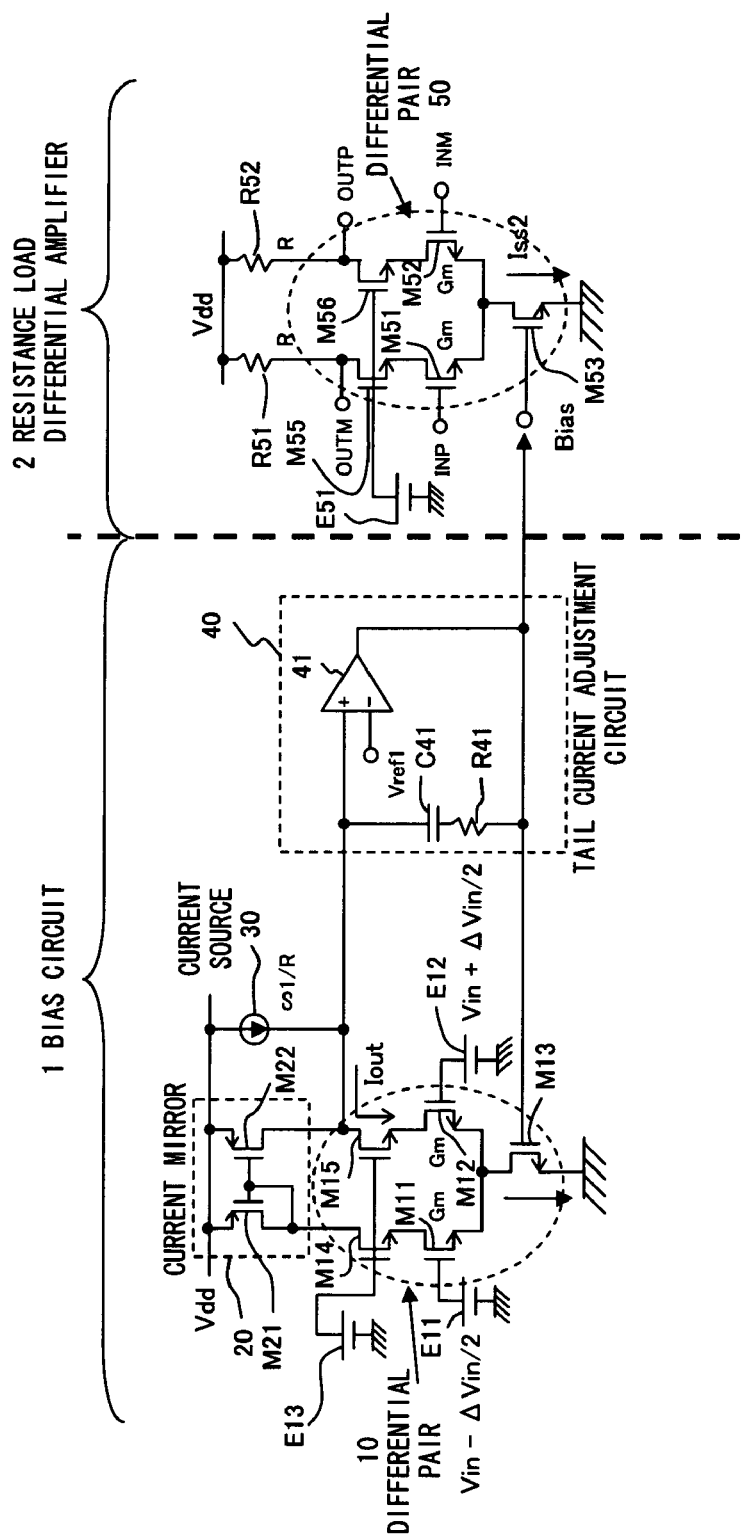
FIG. 9 shows a configuration of a third embodiment of the present invention.

FIG. 9 shows a configuration of a third embodiment of the present invention. This configuration is a configuration in which the present invention is applied to the resistance load differential amplifier of the cascade connection configuration of FIG. 1B.

The configuration of FIG. 9 is obtained by connecting, in cascade, the transistors M14 and M15 which are n-type MOSFETs to the transistors M11 and M12 of the differential pair 10 in the first embodiment of the present invention shown in FIG. 5, and by connecting, in cascade, the transistors M55 and M56 which are n-type MOSFETs to the transistors M51 and M52 of the differential pair 10 in the first embodiment of the present invention in FIG. 5.

In other words, this circuit has a configuration, in which the transistor M14 is inserted into the connection node between the drain of the transistor M21 and the drain of the transistor M14; the transistor M15 is inserted into the connection node between the drain of the transistor M22 and the drain of the transistor M12; the transistor M55 is inserted into the connection node between the resistor R51 and the drain of the transistor M51; and the transistor M56 is inserted into the connection node between the resistor R52 and the drain of the transistor M52. Constant voltages, which are almost the same, are applied to the gate of each of the transistors M14 and M15 by a constant voltage source E13, and constant voltages, which are almost the same, are applied to the gate of each of the transistors M55 and M56 by a constant voltage source E51.

Even in the above circuit shown in FIG. 9, the gain Av of the resistance load differential amplifier 2 is in direct proportion to the product of the transconductance Gm of the differential pair 50 and the resistor value R of the load resistors R51 and R52. Accordingly, by employing the circuit configuration which is the same as that of the differential pair 50 of the resistance load differential amplifier 2 in the differential pair 10 of the bias circuit 1, it is possible that the transconductance Gm of the differential pair 50 is in inverse proportion to the resistance value R of the load resistors R51 and R52, and that the gain Av is accurate and constant.

What is claimed is:

1. A bias circuit of a resistance load differential amplifier, comprising:
   a first differential pair; and
   a control unit for controlling a tail current of the first differential pair, and making an output current of the first differential pair being in inverse proportion to a load resistance in the resistance load differential amplifier when applying a constant potential difference to an input of the first differential pair, wherein:
   the control unit further controls a tail current of a second differential pair constituting the resistance load differential amplifier, and makes the tail current of the second differential pair being in direct proportion to the tail current of the first differential pair.

2. The bias circuit according to claim 1, wherein:
   the first differential pair and the second differential pair employ the same circuit configuration.

3. The bias circuit according to claim 2, wherein:
   transistors constituting the first differential pair and transistors constituting the second differential pair have the same transistor size ratio.

4. The bias circuit according to claim 1, wherein:
   the control unit comprises:
   a current mirror for causing currents in the same quantity to flow into respective transistors in a pair that constitutes the first differential pair;
   a current source for causing the current in inverse proportion to a load resistance to flow; and
   a tail current control unit for controlling a tail current of the first differential pair, and making the output current correspond to the current caused to flow by the current source.

5. The bias circuit according to claim 4, wherein:

the tail current control unit controls the tail current of the first differential pair such that a voltage generated at an output node of the first differential pair when the current source causes the current to flow into the output node of the first differential pair is a prescribed reference voltage.

6. The bias circuit according to claim 5, wherein:

the tail current control unit comprises a differential amplifier for comparing the voltage generated at the output node of the first differential pair and input to the differential amplifier with the prescribed reference voltage, and controls a transistor determining the tail current of the first differential pair by the output of the differential amplifier.

7. The bias circuit according to claim 6, wherein:

a capacitor or a capacitor and resistor in a series connection is connected between an input and an output of the differential amplifier.

8. The bias circuit according to claim 6, wherein:

the control unit controls a transistor that determines the tail current of the second differential pair by the output of the differential amplifier.

9. The bias circuit according to claim 5, wherein:

the tail current control unit comprises:

a differential amplifier for comparing the voltage generated at the output node of the first differential pair and input to the differential amplifier with the prescribed reference voltage;

first and second transistors for controlling a current based on an output of the differential amplifier; and a third transistor constituting a current mirror together with the transistor that determines the tail current of the first differential pair, and being a diode-connected transistor, wherein:

the current controlled by the first transistor is caused to flow into the third transistor; and the control unit controls the transistor that determines the tail current of the second differential pair by the current controlled by the second transistor.

10. The bias circuit according to claim 9, wherein:

the control unit further comprises a fourth transistor constituting a current mirror together with the transistor that determines the tail current of the second differential pair, and being a diode-connected transistor; and the current controlled by the second transistor is caused to flow into the fourth transistor.

11. The bias circuit according to claim 9, wherein:

a capacitor or a capacitor and resistor in a series connection is connected between an input of the differential amplifier and a connection node between the third transistor and the transistor that determines the tail current of the first differential pair.

* * * * *